(12) United States Patent
Cheng et al.

(10) Patent No.: US 10,957,697 B2
(45) Date of Patent: Mar. 23, 2021

(54) POLYSILICON STRUCTURE INCLUDING PROTECTIVE LAYER

(71) Applicant: TAIWAN SEMICONDUCTOR MANUFACTURING COMPANY, LTD., Hsinchu (TW)

(72) Inventors: Yu-Shao Cheng, Taipei (TW); Shin-Yeu Tsai, Zhubei (TW); Chui-Ya Peng, Hsinchu (TW); Kung-Wei Lee, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/101,784

(22) Filed: Aug. 13, 2018

(65) Prior Publication Data

US 2019/0006359 A1 Jan. 3, 2019

Related U.S. Application Data

(62) Division of application No. 14/158,239, filed on Jan. 17, 2014, now Pat. No. 10,050,035.

(51) Int. Cl.
*H01L 21/8222* (2006.01)
*H01L 21/8238* (2006.01)
(Continued)

(52) U.S. Cl.
CPC ........ *H01L 27/092* (2013.01); *H01L 21/0228* (2013.01); *H01L 21/02164* (2013.01);
(Continued)

(58) Field of Classification Search
CPC ......... H01L 27/11521; H01L 27/11568; H01L 21/02266; H01L 21/02271; H01L 21/02274; H01L 21/0228; H01L 21/823814; H01L 21/823864; H01L 29/6653; H01L 29/6656
See application file for complete search history.

(56) References Cited

U.S. PATENT DOCUMENTS 4,577,390 A 3/1986 Haken
4,961,820 A 10/1990 Shingawa et al.
(Continued)

OTHER PUBLICATIONS

Dhong et al., "Sidewall Spacer Technology for MOS and Bipolar Devices", J. Electrochem. Soc. 1986 vol. 133, Issue 2, 389-396, p. 394.

*Primary Examiner* — John A Bodnar
(74) *Attorney, Agent, or Firm* — Hauptman Ham, LLP

(57) ABSTRACT

A manufacture includes a substrate comprising a first portion and a second portion. The manufacture further includes a first polysilicon structure over the first portion of the substrate. The manufacture further includes a second polysilicon structure over the second portion of the substrate. The manufacture further includes two spacers on opposite sidewalls of the second polysilicon structure, wherein each spacer of the two spacers has a concave corner region between an upper portion and a lower portion. The manufacture further includes a protective layer covering the first portion of the substrate and the first polysilicon structure, the protective layer exposing the second portion of the substrate, the second polysilicon structure, and partially exposing the two spacers.

14 Claims, 6 Drawing Sheets

(51) Int. Cl.
   *H01L 21/02*       (2006.01)
   *H01L 29/66*       (2006.01)
   *H01L 21/3205*     (2006.01)
   *H01L 29/78*       (2006.01)
   *H01L 27/11*       (2006.01)
   *H01L 27/06*       (2006.01)
   *H01L 21/311*      (2006.01)
   *H01L 27/092*      (2006.01)
   *H01L 21/28*       (2006.01)
   *H01L 27/112*      (2006.01)

(52) U.S. Cl.
   CPC .. *H01L 21/28247* (2013.01); *H01L 21/31111* (2013.01); *H01L 21/31116* (2013.01); *H01L 21/32051* (2013.01); *H01L 21/32055* (2013.01); *H01L 21/8222* (2013.01); *H01L 21/8238* (2013.01); *H01L 21/82385* (2013.01); *H01L 21/823864* (2013.01); *H01L 27/0623* (2013.01); *H01L 27/11* (2013.01); *H01L 29/6653* (2013.01); *H01L 29/66234* (2013.01); *H01L 29/66674* (2013.01); *H01L 29/7801* (2013.01); *H01L 27/11206* (2013.01)

(56) References Cited

U.S. PATENT DOCUMENTS

| | | | |
|---|---|---|---|
| 5,314,845 A | | 5/1994 | Lee et al. |
| 5,378,659 A | * | 1/1995 | Roman ............... G03F 7/091 438/761 |
| 5,625,212 A | * | 4/1997 | Fukumoto ......... H01L 27/11521 257/315 |
| 6,146,925 A | | 11/2000 | Dennison |
| 6,218,235 B1 | | 4/2001 | Hachisuka et al. |
| 6,392,275 B1 | * | 5/2002 | Jang ................... H01L 21/8249 257/335 |
| 6,424,011 B1 | * | 7/2002 | Assaderaghi ......... G11C 11/005 257/350 |
| 6,599,795 B2 | | 7/2003 | Ogata |
| 6,610,577 B1 | | 8/2003 | Thomas et al. |
| 6,770,927 B2 | | 8/2004 | Cho et al. |
| 8,367,493 B1 | | 2/2013 | Ngo et al. |
| 8,716,104 B1 | | 5/2014 | Zhang et al. |
| 9,019,741 B2 | * | 4/2015 | Lin ..................... H01L 27/112 365/100 |
| 2002/0019090 A1 | | 2/2002 | Ogata et al. |
| 2002/0052128 A1 | | 5/2002 | Yu et al. |
| 2002/0123181 A1 | * | 9/2002 | Hachisuka ........ H01L 21/76834 438/197 |
| 2002/0182795 A1 | * | 12/2002 | Bae ..................... H01L 29/6653 438/200 |
| 2003/0027414 A1 | * | 2/2003 | Ko ...................... H01L 29/6653 438/595 |
| 2004/0065958 A1 | * | 4/2004 | Hachisuka ........ H01L 27/10829 257/758 |
| 2005/0048750 A1 | * | 3/2005 | Kim .................... H01L 29/665 438/586 |
| 2007/0034963 A1 | * | 2/2007 | Sudo ............... H01L 21/823807 257/369 |
| 2008/0164531 A1 | | 7/2008 | Jawarani et al. |
| 2009/0174385 A1 | | 7/2009 | Yen et al. |
| 2010/0068875 A1 | | 3/2010 | Yeh et al. |
| 2013/0115763 A1 | | 5/2013 | Takamure et al. |

\* cited by examiner

POLYSILICON STRUCTURE INCLUDING PROTECTIVE LAYER

PRIORITY CLAIM

The present application is a divisional of U.S. application Ser. No. 14/158,239, filed Jan. 17, 2014, which is incorporated herein by reference in its entirety.

BACKGROUND

In some applications, a logic circuit, static random access memory (SRAM), and one-time-programmable (OTP) memory of an integrated circuit are fabricated on the same substrate. In some applications, when performing a self-aligned silicide (salicide) process to form electrical contacts on the logic or SRAM part, the OTP part of the integrated circuit is protected by a protective layer. The performance of the logic circuit, the SRAM, and the OTP memory is affected by the thickness of the protective layer in the OTP part and residue of materials used to form the protective layer in the SRAM part.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
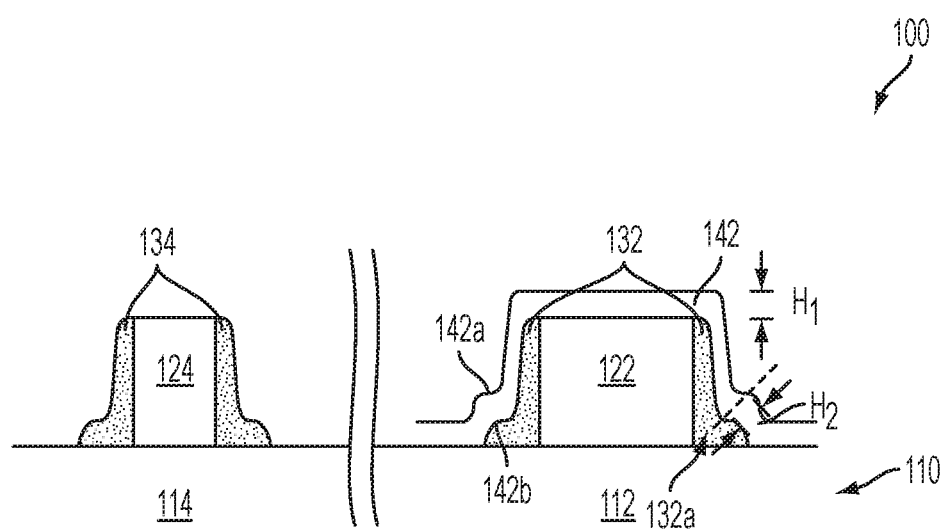
FIG. 1 is a cross-sectional view of an integrated circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

By forming a layer of protective material that is sufficiently thick and yet conformal to a contour of a polysilicon structure and corresponding spacers of an integrated circuit, a process window of a subsequent removal process is enlarged compared to a non-conformal layer of protective material. As a result, the integrated circuit has a better silicide formation in the logic or SRAM part and better leakage prevention in the OTP part. In some embodiments, the disclosed embodiments are suitable to be used in a Bipolar-CMOS-DMOS (BCD) process. Bipolar stands for bipolar junction transistors, CMOS stands for complementary metal-oxide-semiconductor transistors, and DMOS stands for double-diffused metal-oxide-semiconductor transistors.

FIG. 1 is a cross-sectional view of an integrated circuit 100 in accordance with some embodiments. In some embodiments, integrated circuit 100 depicted in FIG. 1 is an intermediate product, which will be further processed by one or more manufacturing processes in order to form a functional integrated circuit. Other active electrical components and passive electrical components of the integrated circuit 100 are not shown in FIG. 1.

Integrated circuit 100 has a substrate 110, a first polysilicon structure 122, a second polysilicon structure 124, a first set of spacers 132, a second set of spacers 134, and a protective layer 142.

In some embodiments, substrate 110 includes: an elementary semiconductor such as silicon or germanium in crystal, polycrystalline, or an amorphous structure; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, substrate 110 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, substrate 110 is a semiconductor on insulator. In some examples, substrate 110 includes an epitaxial layer or a buried layer. In other examples, substrate 110 includes a multilayer compound semiconductor structure.

In some embodiments, substrate 110 generally exhibits a conductive characteristic similar to that of an intrinsic semiconductor material or a semiconductor material having a predetermined doping type. In some embodiments, the predetermined doping type is a P-type doping.

Figure 5:
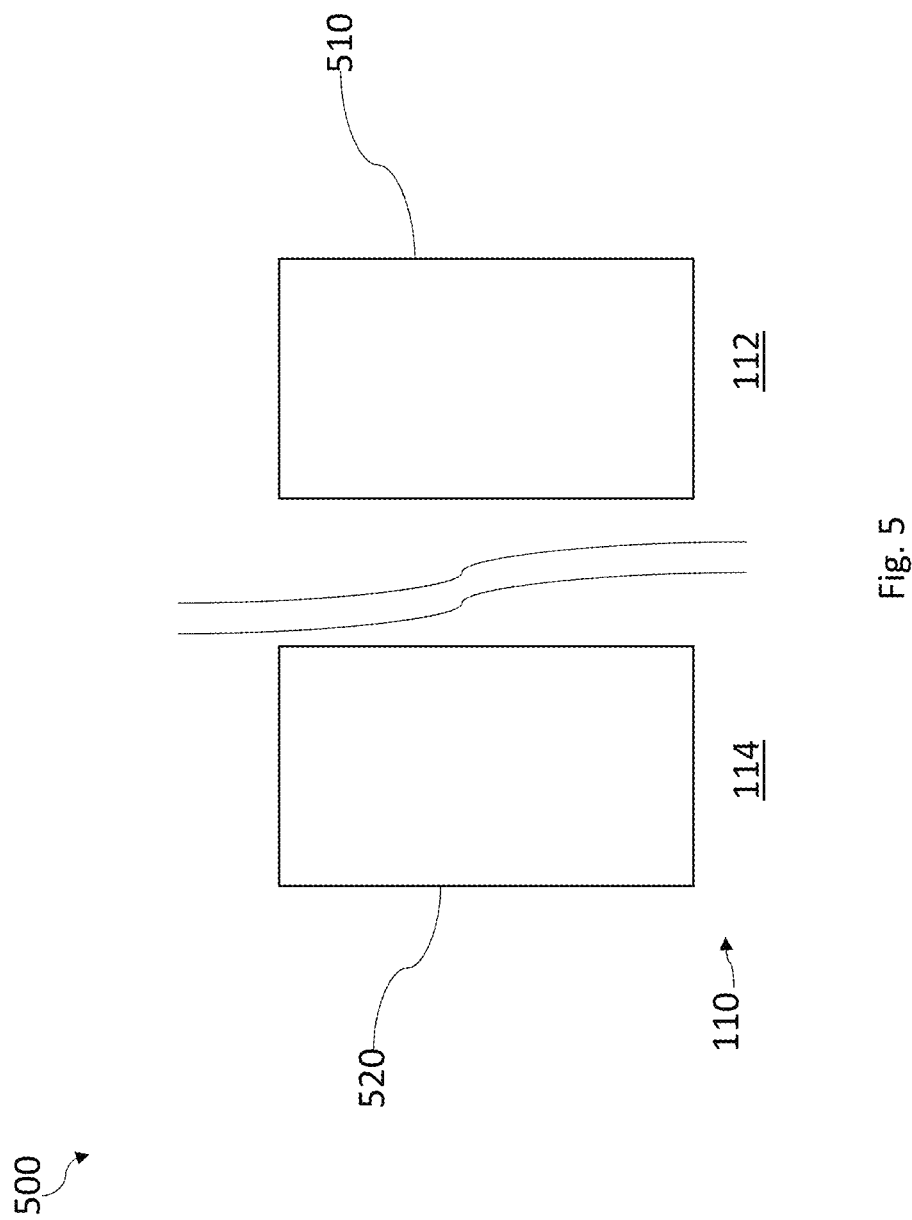
FIG. 5 is a schematic top view of an integrated circuit according to some embodiments.

Substrate 110 has a first portion 112 and a second portion 114. In some embodiments, two or more of a logic circuit, a static random access memory (SRAM), or a one-time-programmable (OTP) memory are fabricated on substrate 110, where the OTP memory is formed on first portion 112 of substrate 110, and the logic circuit and/or the SRAM are formed on second portion 114 of substrate 110. FIG. 5 includes an integrated circuit 500 including an SRAM 520 on second portion 114 of substrate 110; and an OTP memory 510 on first portion 112 of substrate 110. In some embodiments, the logic circuits, SRAM, and OTP memory are fabricated using a bipolar-CMOS-DMOS (BCD) process. In other words, in some embodiments, at least one bipolar junction transistor (BJT) device, at least one complementary metal-oxide-semiconductor (CMOS) device, and at least one double-diffused metal-oxide-semiconductor (DMOS) device are formed on substrate 110.

First polysilicon structure 122 is over first portion 112 of substrate 110. First set of spacers 132 includes two spacers on opposite sidewalls of first polysilicon structure 122. Spacers 132 are L-shaped spacers. In some embodiments, spacers 132 have a shape other than an L-shape. In some embodiments, spacers 132 have a material including silicon nitride. In some embodiments, spacers 132 have a multi-layer structure. In some embodiments, integrated circuit 100 has a one-time-programmable (OTP) device that includes first polysilicon structure 122 and spacers 132. In some embodiments, a gate dielectric (not shown) is formed between polysilicon structure 122 and substrate 110. In some embodiments, one or more layers of other materials are formed between polysilicon structure 122 and substrate 110.

Second polysilicon structure 124 is over second portion 114 of substrate 110. Second set of spacers 134 includes two spacers on opposite sidewalls of second polysilicon structure 124. Spacers 134 are L-shaped spacers. In some embodiments, spacers 134 have a shape other than an L-shape. In some embodiments, spacers 134 have a material including silicon nitride. In some embodiments, spacers 134 have a multi-layer structure. In some embodiments, integrated circuit 100 has a logic circuit or an SRAM that includes second polysilicon structure 124 and spacers 134. In some embodiments, a gate dielectric (not shown) is formed between polysilicon structure 124 and substrate 110. In some embodiments, one or more layers of other materials are formed between polysilicon structure 124 and substrate 110.

In some embodiments, first and second polysilicon structure 122 and 124 are concurrently formed and include similar materials. In some embodiments, first and second set of spacers 132 and 134 are concurrently formed and include similar configuration and materials.

Protective layer 142 covers first portion 112 of substrate 110, first polysilicon structure 122, and first set of spacers 132. Protective layer 142 is free from covering second portion 114 of substrate 110, second polysilicon structure 124, and second set of spacers 134. A thickness of protective layer 142 is measureable as a distance between an upper surface 142a and a lower surface 142b of protective layer 142 along a normal direction of the lower surface 142b of protective layer 142. Protective layer 142 having a thickness $H_1$ over first polysilicon structure 122, and the thickness $H_1$ is equal to or greater than 500 Å. In some embodiments, thickness $H_1$ represents the maximum thickness of protective layer 142 directly over first polysilicon structure 122. Protective layer 142 having a thickness $H_2$ over spacers 132, and the thickness $H_2$ is equal to or less than 110% of the first thickness $H_1$. In some embodiments, thickness $H_2$ represents the maximum thickness of protective layer 142 directly over spacers 132. In some embodiments, the maximum thickness of protective layer 142 over spacers 132 occurs at about a corner portion 132a of the spacers 132.

Protective layer 142 thus provides sufficient protection to first polysilicon structure 122 while second polysilicon structure 124 is being processed by a silicide process. Also, the difference between thickness $H_2$ and thickness $H_1$ is small enough (equal to or less than 10% of thickness $H_1$) that eases a requirement for the processing window for a subsequent protective layer removal process.

Figure 2:
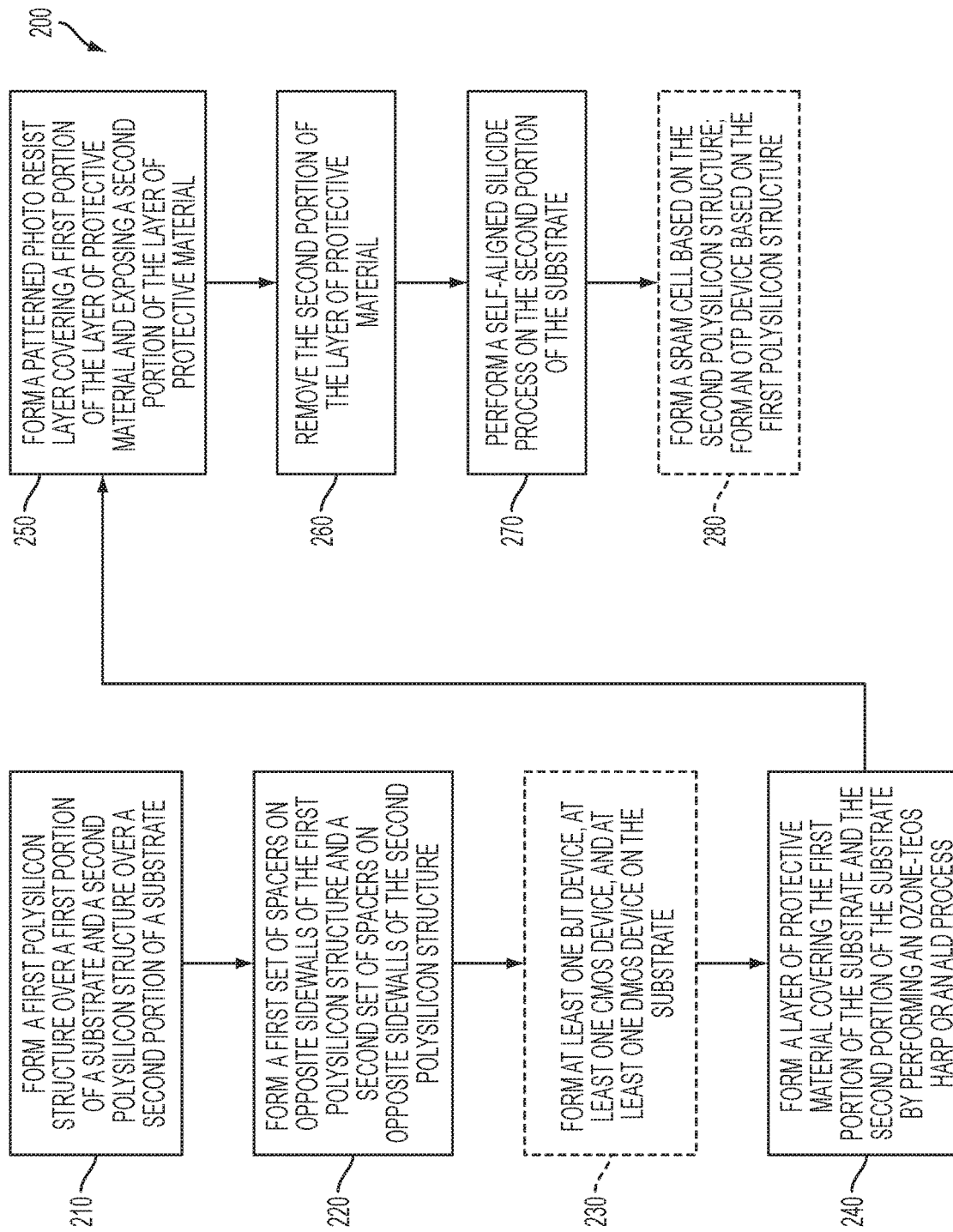
FIG. 2 is a flow chart of a method of fabricating an integrated circuit in accordance with some embodiments.
Figure 3A:
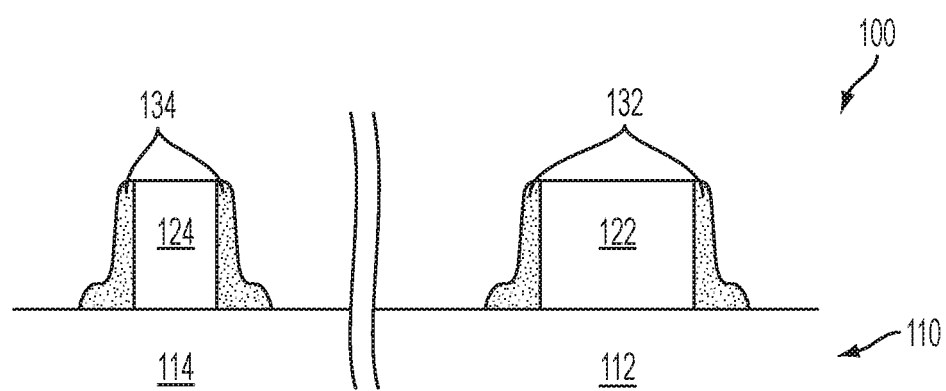
FIGS. 3A to 3C are cross-sectional views of an integrated circuit at various manufacturing stages in accordance with some embodiments.
Figure 3B:
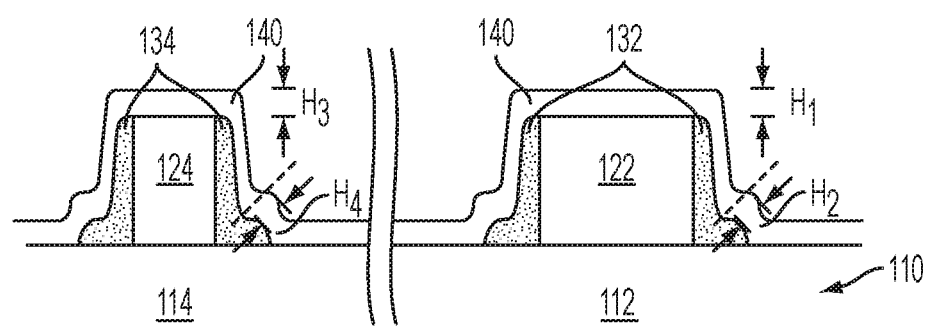
Figure 3C:
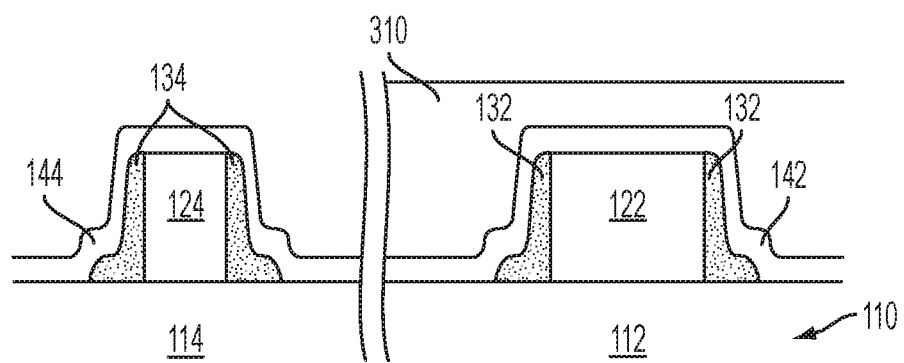

FIG. 2 is a flow chart of a method 200 of fabricating an integrated circuit 100 in accordance with some embodiments. FIGS. 3A to 3C are cross-sectional views of integrated circuit 100 at various manufacturing stages in accordance with some embodiments. Components in FIGS. 2 and 3A to 3C that are the same or similar to those in FIG. 1 are given the same reference numbers, and detailed description thereof is omitted. It is understood that additional operations may be performed before, during, and/or after the method 200 depicted in FIG. 2, and that some other processes may only be briefly described herein.

As depicted in FIG. 2 and FIG. 1, the process 200 begins at operation 210, where first polysilicon structure 122 is formed over first portion 112 of substrate 110 and second polysilicon structure 124 is formed over second portion 114 of substrate 110. In some embodiments, operation 210 includes forming a layer of polysilicon material over substrate 110 and then patterning the layer of polysilicon material into first and second polysilicon structures 122 and 124 by performing a lithographic process followed by a removal process.

The process 200 proceeds to operation 220, where first set of spacers 132 and second set of spacers 134 are formed on sidewalls of polysilicon structure 122 and 124. In some embodiments, operation 220 includes forming a layer of spacer material over first and second polysilicon structures 122 and 124 and substrate 110 and then patterning the layer of spacer material into first and second sets of spacers 132 and 134 by performing a removal process. In some embodiments, the layer of spacer material includes silicon nitride. In some embodiments, the removal process includes an anisotropic etch process.

FIG. 3A is a cross-sectional view of integrated circuit 100 after operation 220.

As depicted in FIG. 2 and FIG. 1, the process 200 proceeds to operation 230, where one or more other electrical components are also formed on substrate 110. In some embodiments, integrated circuit 100 is fabricated by a BCD process, and operation 230, in conjunction with operations 210 and/or 220, are usable to form at least one bipolar junction transistor (BJT), at least one complementary metal-oxide-semiconductor (CMOS) device, and at least one double-diffused metal-oxide-semiconductor (DMOS) device on substrate 110. In some embodiments, operation 230 is performed before, after, or concurrently with operations 210 and 220. In some embodiments, operation 230 is omitted.

The process 200 proceeds to operation 240, where a layer of protective material is formed over substrate 110. In some embodiments, the layer of protective material includes silicon oxide, and operation 240 includes performing an ozone-tetraethyl orthosilicate (TEOS) high aspect ratio process (HARP) or an atomic layer deposition (ALD) process. In some embodiments, the ozone-TEOS HARP process or the ALD process is suable to form a layer of protective material that is conformal to a contour of polysilicon structure 122 and 124 and corresponding spacers 132 and 134 of an integrated circuit 100, even when the thickness of the layer of protective material over polysilicon structure 122 and 124 is equal to or greater than 500 Å.

FIG. 3B is a cross-sectional view of integrated circuit 100 after operation 240. A layer of protective material 140 covers the first and second polysilicon structures 122 and 132 and first and second sets of spacers 132 and 134.

The layer of protective material 140 has a thickness $H_1$ over first polysilicon structure 122, and the thickness $H_1$ is equal to or greater than 500 Å. In some embodiments, thickness $H_1$ represents the maximum thickness of the layer of protective material 140 over first polysilicon structure 122. The layer of protective material 140 having a thickness $H_2$ over spacers 132, and the thickness $H_2$ is equal to or less than 110% of the first thickness $H_1$. In some embodiments, thickness $H_2$ represents the maximum thickness of the layer of protective material 140 over spacers 132.

Also, the layer of protective material 140 has a maximum thickness $H_3$ over second polysilicon structure 124, and the maximum thickness $H_3$ is equal to or greater than 500 Å. The layer of protective material 140 having a maximum thickness $H_4$ over spacers 134, and the thickness $H_4$ is equal to or less than 110% of the thickness $H_3$. In some embodiments, the difference between thickness $H_4$ and thickness $H_3$ is small enough (e.g., equal to or less than 10% of thickness $H_3$) that eases a requirement for the processing window for one or more subsequent protective layer removal processes.

As depicted in FIG. 2 and FIG. 1, the process 200 proceeds to operation 250, where a patterned photo resist layer is formed over a portion of the layer of protective material 140 and the first portion of substrate 112.

FIG. 3C is a cross-sectional view of integrated circuit 100 after operation 250. A patterned photo resist layer 310 is formed to cover a first portion 142 of the layer of protective material 140 that covers the first portion 112 of the substrate 110 and to expose a second portion 144 of the layer of protective material 140 that covers the second portion 114 of the substrate 110.

As depicted in FIG. 2, FIG. 1, and FIG. 3C, the process 200 proceeds to operation 260, where the second portion 144 of the layer of protective material 140 is removed. In some embodiments, operation 260 includes performing a dry etch process or a wet etch process, or a combination thereof. In some embodiments, operation 260 includes performing a dry etch process and then performing a wet etch process after the performing the dry etch process. After operation 260, patterned photo resist layer 310 is removed by an ashing process.

Because the layer of protective material 140 is conformally formed along a contour of polysilicon structure 124 and spacers 134, the process window for the dry etch process is sufficient large for yield control, and the process window for the wet etch process is sufficient large for protective layer peeling prevention.

FIG. 1 depicts a cross-sectional view of integrated circuit 100 after operation 260.

As depicted in FIG. 2, the process 200 proceeds to operation 270, where a self-aligned silicide (salicide) process is performed on the second portion 114 of the substrate 110 while the first portion 112 of the substrate 110 is covered by the first portion 142 of the layer of protective material. The process 200 then proceeds to operation 280, where a logic circuit or an SRAM cell is formed based on the second polysilicon structure 124 and spacers 134, and an OTP device is formed based on first polysilicon structure 122 and spacers 132. In some embodiments, operation 280 is omitted, and polysilicon structures 122 and 124 are used to form other types of electrical components.

Figure 4:
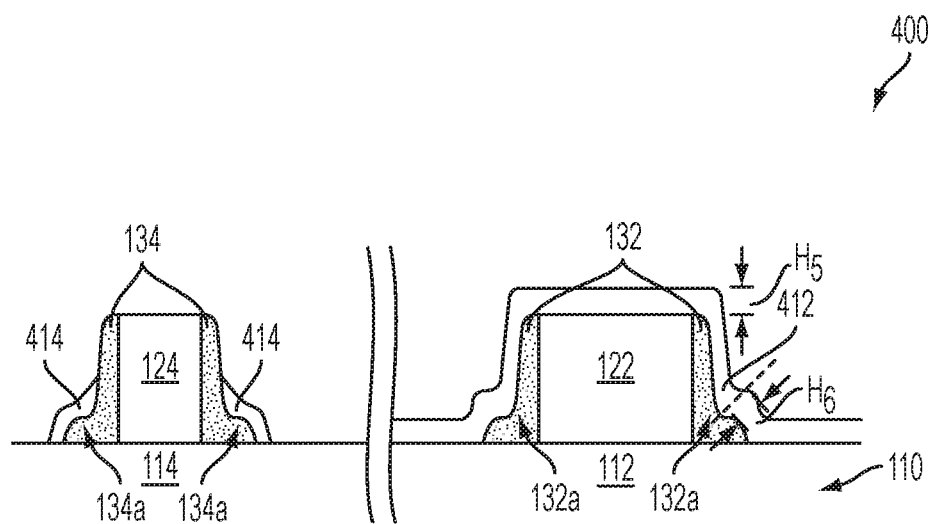
FIG. 4 is a cross-sectional view of an integrated circuit that is fabricated by a process different from that depicted in FIG. 2 in accordance with some embodiments.

FIG. 4 is a cross-sectional view of an integrated circuit 400 that is fabricated by a process different from that depicted in FIG. 2 in accordance with some embodiments. Components in FIG. 4 that are the same or similar to those in FIG. 1 are given the same reference numbers, and detailed description thereof is omitted.

Integrated circuit 400 includes a protective layer 412 over first polysilicon structure 122, first set of spacers 132, and first portion 112 of substrate 110. Integrated circuit 400 further includes residue protective materials 414 near the corner portion 134a of second set of spacers 134 of and extending to an upper surface of second portion 114 of substrate 110.

Compared with integrated circuit 100, a processing operation comparable to operation 240 for manufacturing integrated circuit 400 is performed by a Plasma-enhanced chemical vapor deposition (PECVD) process. The PECVD process causes accumulation of protective materials at corner portions 132a and 134a. As a result, when a thickness $H_5$ of protective layer 412 over first polysilicon structure 122 is equal to or greater than 500 Å, a thickness $H_6$ of protective layer 412 around corner portion 132a of first set of spacers 132 is greater than 110% of thickness $H_5$. In some embodiments, thickness $H_6$ of protective layer 412 is greater than 120% of thickness $H_5$.

At a stage comparable to FIG. 3C, second polysilicon structure 122 of integrated circuit 400 is covered by a layer of protective material in a manner similar to protective layer 412 over first silicon structure 122. The difference between thickness $H_6$ and thickness $H_5$ is too large (greater than 10% of thickness $H_5$) that renders a requirement for the processing window for a subsequent protective layer removal process more stringent than that of operation 260 or technically infeasible. As a result, residue protective materials 414 near the corner portion 134a of second set of spacers 134 are not fully removed.

Figure 6:
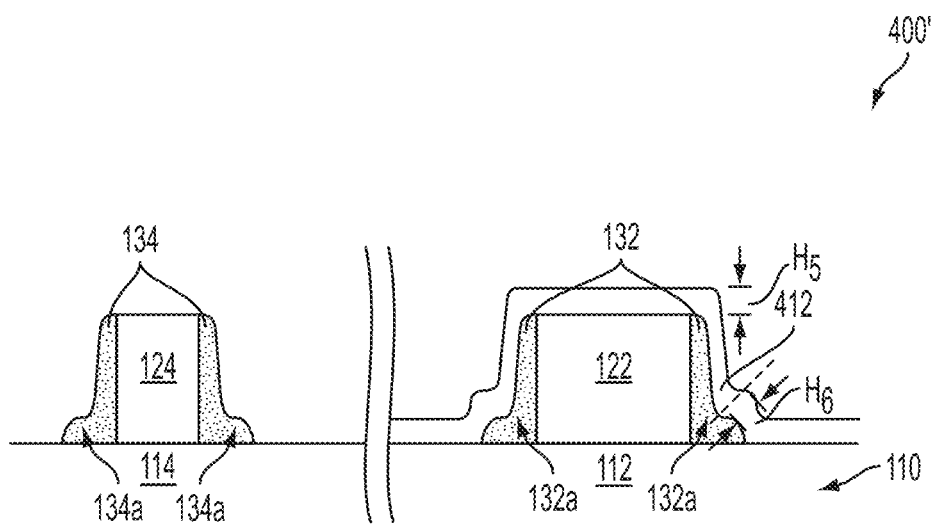
FIG. 6 is a cross-sectional view of an integrated circuit according to some embodiments.

In some embodiments, residue protective materials 414 hinder a subsequent salicidation process comparable to operation 270. In some embodiments, in order to reduce or eliminate residue protective materials 414, protective layer 412 becomes too thin to effectively protect polysilicon structure 122 from the subsequent salicidation process intended for polysilicon structure 124 and/or second portion of substrate 114. FIG. 6 is a cross-sectional view of integrated circuit 400' according to some embodiments. In comparison with integrated circuit 400, integrated circuit 400' does not include residue protective materials 414.

An aspect of this description relates to a manufacture. The manufacture includes a substrate comprising a first portion and a second portion. The manufacture further includes a first polysilicon structure over the first portion of the substrate. The manufacture further includes a second polysilicon structure over the second portion of the substrate. The manufacture further includes two spacers on opposite sidewalls of the second polysilicon structure, wherein each spacer of the two spacers has a concave corner region between an upper portion and a lower portion. The manufacture further includes a protective layer covering the first portion of the substrate and the first polysilicon structure, the protective layer exposing the second portion of the substrate, the second polysilicon structure, and partially exposing the two spacers. In some embodiments, the two spacers are L-shaped spacers. In some embodiments, the manufacture further includes a static random access memory (SRAM) cell comprising the second polysilicon structure and the two spacers. In some embodiments, the manufacture further includes a one-time-programmable (OTP) device comprising the first polysilicon structure. In some embodiments, the protective layer comprises silicon oxide. In some embodiments, the manufacture further includes another two spacers on opposite sidewalls of the first polysilicon structure. In some embodiments, the protective layer has a second maximum thickness over the another two spacers, and the second maximum thickness is equal to or less than 110% of the first maximum thickness. In some embodiments, the manufacture further includes at least one bipolar junction transistor (BJT) device on the substrate; at least one complementary metal-oxide-semiconductor (CMOS) device on the substrate; and at least one double-diffused metal-oxide-semiconductor (DMOS) device on the substrate.

An aspect of this description relates to a semiconductor device. The semiconductor device includes a substrate and a first polysilicon structure over a first portion of the substrate. The semiconductor device further includes a first spacer on a sidewall of the first polysilicon structure, wherein the first spacer has a concave corner region between an upper portion and a lower portion. The semiconductor device further includes a second polysilicon structure over a second portion of the substrate. The semiconductor device further includes a second spacer on a sidewall of the second polysilicon structure. The semiconductor device further includes a protective layer covering an entirety of the first spacer and the first polysilicon structure, wherein a thickness of the protective layer over the concave corner region is at least 110% of a thickness of the protective layer over the first polysilicon structure, and the protective layer exposes the second polysilicon structure. In some embodiments, the protective layer partially covers the second spacer. In some embodiments, the thickness of the protective layer over the first polysilicon structure is at least 500 angstroms. In some embodiments, the thickness of the protective layer over the concave corner region is at least 120% of the thickness of the protective layer over the first polysilicon structure. In some embodiments, at least one of the first spacer or the second spacer is a multi-layer structure. In some embodiments, a material of the first spacer is a same material as the second spacer.

An aspect of this description relates to a semiconductor device. In some embodiments, a substrate and a first polysilicon structure over a first portion of the substrate. The semiconductor device further includes a first spacer on a sidewall of the first polysilicon structure. The semiconductor device further includes a second polysilicon structure over a second portion of the substrate. The semiconductor device further includes a second spacer on a sidewall of the second polysilicon structure wherein the second spacer has a concave corner region between an upper portion and a lower portion. The semiconductor device further includes a protective layer covering an entirety of the first spacer and the first polysilicon structure, wherein the protective layer at least partially exposes the upper portion of the second spacer. In some embodiments, a thickness of the protective layer over the concave corner region is at least 110% of a thickness of the protective layer over the first polysilicon structure. In some embodiments, a difference between a thickness of the protective layer over the concave corner region and a thickness of the protective layer over the first polysilicon structure is equal to or less than 10% of the thickness of the protective layer over the first polysilicon structure. In some embodiments, the semiconductor device further includes a static random access memory (SRAM) cell, wherein the second polysilicon structure is part of the SRAM cell. In some embodiments, the semiconductor device further includes a one-time-programmable (OTP) device, wherein the first polysilicon structure is part of the OTP device. In some embodiments, the protective layer exposes an entirety of the second spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacture, comprising:
    a substrate comprising a first portion and a second portion;
    a first polysilicon structure over the first portion of the substrate;
    a second polysilicon structure over the second portion of the substrate;
    two spacers on opposite sidewalls of the second polysilicon structure, wherein each spacer of the two spacers has a concave corner region between an upper portion and a lower portion; and
    a protective layer covering the first portion of the substrate and the first polysilicon structure, the protective layer exposing the second portion of the substrate, the second polysilicon structure, and partially exposing a sidewall of the two spacers above the concave corner region, and the protective layer covering an entirety of the lower portion of the spacers of the second polysilicon structure.

2. The manufacture of claim 1, wherein the two spacers are L-shaped spacers.

3. The manufacture of claim 1, further comprising:
    a static random access memory (SRAM) cell comprising the second polysilicon structure and the two spacers.

4. The manufacture of claim 1, further comprising:
    a one-time-programmable (OTP) device comprising the first polysilicon structure.

5. The manufacture of claim 1, wherein the protective layer comprises silicon oxide.

6. The manufacture of claim 1, further comprising another two spacers on opposite sidewalls of the first polysilicon structure.

7. The manufacture of claim 6, wherein the protective layer has a second maximum thickness over the another two spacers, and the second maximum thickness is equal to or less than 110% of a first maximum thickness of the protective layer over the first polysilicon structure.

8. The manufacture of claim 1, wherein the protective layer directly contacts the first portion of the substrate.

9. A semiconductor device, comprising:
    a substrate;
    a first polysilicon structure over a first portion of the substrate;
    a first spacer on a sidewall of the first polysilicon structure;
    a second polysilicon structure over a second portion of the substrate;
    a second spacer on a sidewall of the second polysilicon structure wherein the second spacer has a concave corner region between an upper portion and a lower portion; and
    a protective layer covering an entirety of the first spacer and the first polysilicon structure, wherein the protective layer at least partially exposes the upper portion of the second spacer, and the protective layer directly contacts the first portion and the second portion substrate.

10. The semiconductor device of claim 9, wherein a thickness of the protective layer over the concave corner region is at least 110% of a thickness of the protective layer over the first polysilicon structure.

11. The semiconductor device of claim 9, wherein a difference between a thickness of the protective layer over the concave corner region and a thickness of the protective layer over the first polysilicon structure is greater than 10% of the thickness of the protective layer over the first polysilicon structure.

12. The semiconductor device of claim 9, further comprising a static random access memory (SRAM) cell, wherein the second polysilicon structure is part of the SRAM cell.

13. The semiconductor device of claim 9, further comprising a one-time-programmable (OTP) device, wherein the first polysilicon structure is part of the OTP device.

14. The semiconductor device of claim 9, wherein the protective layer comprises silicon oxide.

* * * * *